(12) United States Patent
Cheung et al.

(10) Patent No.: US 9,712,848 B2
(45) Date of Patent: Jul. 18, 2017

(54) FRAME BUFFER COMPRESSION USING SEPARATE AGGREGATION OF FIXED-LENGTH AND VARIABLE-LENGTH COMPONENTS OF CODEWORDS

(71) Applicant: ViXS Systems Inc., Toronto (CA)

(72) Inventors: Wendy Wai Yin Cheung, Markham (CA); Xin Guo, Toronto (CA)

(73) Assignee: VIXS SYSTEMS INC., Toronto (CA)

( * ) Notice: Subject to any disclaimer, the term of this patent is extended or adjusted under 35 U.S.C. 154(b) by 239 days.

(21) Appl. No.: 14/536,859

(22) Filed: Nov. 10, 2014

(65) Prior Publication Data

US 2016/0134878 A1    May 12, 2016

(51) Int. Cl.
*H04N 19/91* (2014.01)
*H04N 19/88* (2014.01)
*H03M 7/40* (2006.01)

(52) U.S. Cl.
CPC .......... *H04N 19/91* (2014.11); *H03M 7/4031* (2013.01); *H04N 19/88* (2014.11)

(58) Field of Classification Search
CPC ......... H04N 19/88; H04N 19/90; H04N 19/91
See application file for complete search history.

(56) References Cited

U.S. PATENT DOCUMENTS

| | | | | |
|---|---|---|---|---|
| 5,249,066 A | * | 9/1993 | Fukuda | H04N 19/60 375/E7.144 |
| 5,625,355 A | * | 4/1997 | Takeno | H03M 7/425 341/106 |
| 5,956,429 A | * | 9/1999 | Burns | G06T 9/007 341/63 |
| 6,696,992 B1 | * | 2/2004 | Chu | H03M 7/3084 341/50 |
| 2004/0081241 A1 | * | 4/2004 | Kadono | H03M 7/40 375/240.23 |
| 2004/0233076 A1 | * | 11/2004 | Zhou | H03M 7/425 341/67 |

(Continued)

OTHER PUBLICATIONS

Mihir Mody, "Understanding In-loop Filtering in the HEVC Video Standard", EDN Network, Jun. 21, 2013, <http://www.edn.com/design/consumer/4417218/Understanding-in-loop-filtering-in-the-HEVC-video-standard>, 13 pages.

*Primary Examiner* — Christopher Findley (57) ABSTRACT

Each set of pels of an image frame is encoded into a corresponding set of codewords having fixed-length and unary variable-length components. The variable-length components are combined into a variable-length portion and the fixed-length components are separately combined into a fixed-length portion that is attached to the variable-length portion to complete a bit segment. For decompression, a first bit string of a fixed number of bits is identified as a fixed-length portion of the bit segment. A search window placed adjacent to the first bit string is scanned to find a second bit string having a number of termination bits equal to the number of codewords in the set, with the second bit string thus representing the variable-length portion of a corresponding bit segment. Each variable-length component of the identified variable-length portion is combined with a corresponding fixed-length component of the identified fixed-length portion to recreate a corresponding codeword.

20 Claims, 5 Drawing Sheets

(56) References Cited

U.S. PATENT DOCUMENTS

| | | | |
|---|---|---|---|
| 2007/0047654 A1* | 3/2007 | Kim | H04N 19/13 375/240.18 |
| 2013/0272389 A1* | 10/2013 | Sze | H04N 19/00121 375/240.03 |
| 2013/0300591 A1* | 11/2013 | Marpe | H03M 7/40 341/67 |
| 2014/0184625 A1* | 7/2014 | Shah | G06T 1/60 345/530 |

* cited by examiner

FRAME BUFFER COMPRESSION USING SEPARATE AGGREGATION OF FIXED-LENGTH AND VARIABLE-LENGTH COMPONENTS OF CODEWORDS

FIELD OF THE DISCLOSURE

The present disclosure generally relates to video processing and more particularly to frame buffer compression.

BACKGROUND

In the course of processing video data for display at a display device, image data representing an image frame is temporarily stored in a frame buffer. In an effort to reduce the frame buffer size and to reduce memory traffic due to read and write accesses to the frame buffer, the image data may be compressed when stored in the frame buffer. Arithmetic coding often is used to encode the uncompressed image data to generate compressed codewords, which are then stored in the frame buffer as a compressed version of the image data. Generally, the arithmetic coding process generates a codeword having two components: a fixed-length component that has the same number of bits regardless of the input data; and a variable-length component that has a variable number of bits depending on the input data. In conventional implementations, the codewords are simply concatenated together into a bit string for storage in the frame buffer such that the variable-length components and fixed-length components are interleaved. Accordingly, when decompressing the compressed data in the frame buffer, the decompression module parses the bit string to locate the first bit with a value of 0 (hereinafter, a "0 bit") as the termination bit of a corresponding variable-length component, and thus identify the variable-length component as such. In many instances it may be desired to decode multiple codewords in one clock cycle, and thus the decompression module may look ahead in the bit string and flag upcoming 0 bits as termination bits. However, due to the interleaved nature of the fixed-length components and variable-length components, one or more of the flagged 0 bits actually may be bits from a fixed-length component rather than a termination bit of a variable-length component. To compensate for this, conventional decoding modules implement additional logic to identify and eliminate the inadvertent flagging of 0 bits of fixed-length components as termination bits of variable-length components of codewords. This additional logic increases the complexity, cost, and power consumption of the resulting decompression module.

BRIEF DESCRIPTION OF THE DRAWINGS

The present disclosure may be better understood, and its numerous features and advantages made apparent to those skilled in the art by referencing the accompanying drawings.

DETAILED DESCRIPTION

Frame buffer compression techniques often rely on an arithmetic coding process to generate a set of codewords having both a fixed-length component and a variable-length component. The variable-length component is a unary value having a variable number of bits of one bit value terminated by a bit having the opposite bit value (and thus referred to as the "termination bit"). Typically, the termination bit is represented as a 0 bit, whereas the bits of the variable number of bits are 1 bits, but in other implementations the 1 bit may be used as the termination bit and 0 bits as the variable number of bits. In conventional systems, these undivided codewords are concatenated together such that the output is a stream of undivided codewords. This interleaved approach introduces additional parsing complexity during decompression as it is not easily determined whether a bit value used for the termination bit is an actual termination bit for a variable-length component or a bit value of a fixed-length component.

FIGS. 1-6 illustrate example techniques for frame buffer compression that simplifies the decoding process. In at least one embodiment, an image frame is partitioned into a set of picture elements (pels), and each set of pels is encoded into a corresponding set of codewords. Each codeword has a fixed-length component and a unary variable-length component ending in a predetermined termination bit. To facilitate the subsequent parsing of the resulting compressed data, each codeword is separated into its constituent variable-length and fixed-length components, and the variable-length components of a set of codewords are aggregated or otherwise combined into a continuous variable-length portion of a bit segment of the compressed data and the fixed-length components of the set of codewords are aggregated or otherwise combined into a continuous fixed-length portion of the bit segment. The fixed-length portion is then prepended or appended (depending on implementation) to the variable-length portion to complete the corresponding bit segment.

When decompressing the compressed image data, a search window is positioned in the bit stream representing the compressed image data and the search window is scanned to find a first bit string having a number of termination bits equal to the number of codewords in each bit segment. As such, the first bit string represents the variable-length portion of a corresponding bit segment. A second bit string preceding (in a prepended fixed-length portion implementation) or following (in an appended fixed-length portion implementation) the first bit string and having a number of bits equal to the number of codewords in a set multiplied by the number of bits in a fixed-length component is identified as the fixed-length portion of the corresponding bit segment. Each variable-length component of the identified variable-length portion is then combined with a corresponding fixed-length component of the identified fixed-length portion to recreate the corresponding codeword of the set of codewords. The set of codewords then are decoded to generate the uncompressed data representative of a set of pels, which may then be provided for display as a corresponding portion of an image frame. By separately aggregating the variable-length components and fixed-length components for multiple codewords, the variable-length components of multiple codewords can be more easily identified in the resulting compressed data, thereby reducing the complexity, cost, and power consumption of the decompressing engine implemented to decompress the compressed image data for display.

Figure 1:
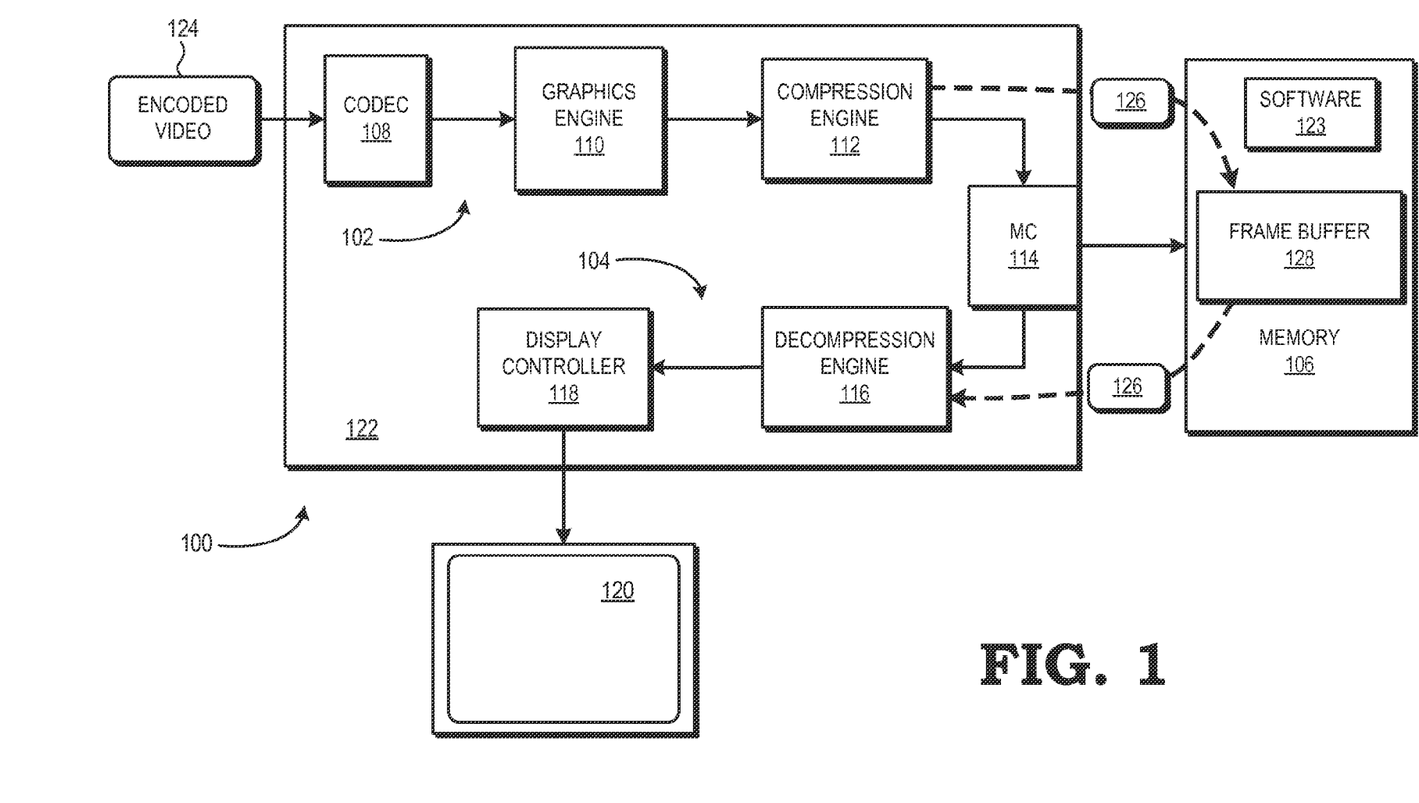
FIG. 1 is a block diagram illustrating a multimedia system utilizing frame buffer compression in accordance with at least one embodiment of the present disclosure.

FIG. 1 illustrates an example multimedia system 100 implementing block-by-block video texture mapping in accordance with at least one embodiment of the present disclosure. The multimedia system 100 includes a video processing system 102, a display system 104, and a memory 106. The video processing system 102 comprises an encoder/decoder (codec) engine 108, a graphics engine 110, a compression engine 112, and a memory controller 114. The display system 104 includes a decompression engine 116 and a display controller 118 coupleable to a display 120. In the illustrated embodiment, the components of the video processing system 102 and the display system 104 are implemented on the same device, such as in the same integrated circuit (IC) package 122. However, in other embodiments, the video processing system 102 and the display system 104 may be implemented as separate devices.

The codec engine 108, the graphics engine 110, the compression engine 112, the decompression engine 116, and the display controller 118 each may be implemented entirely in hard-coded logic (that is, hardware), as a combination of software 123 stored in a non-transitory computer readable storage medium (e.g., the memory 106) and one or more processors to access and execute the software, or as combination of hard-coded logic and software-executed functionality. To illustrate, in one embodiment, the multimedia system 100 implements the IC package 122 whereby portions of the components 108, 110, 112, 116, and 118 are implemented as hardware logic, and other portions are implemented via firmware (one embodiment of the software 123) stored at the IC package 122 and executed by one or more processors of the IC package 122. Such processors can include a central processing unit (CPU), a graphics processing unit (GPU), a microcontroller, a digital signal processor, a field programmable gate array, programmable logic device, state machine, logic circuitry, analog circuitry, digital circuitry, or any device that manipulates signals (analog and/or digital) based on operational instructions that are stored in the memory 106 or other non-transitory computer readable storage medium. To illustrate, the codec engine 108, the compression engine 112, and the decompression engine 116 may be implemented as, for example, one or more CPUs executing video decoding/compression/decompression software, while the graphics engine 110 may be implemented as, for example, a GPU executing graphics software.

The non-transitory computer readable storage medium storing such software can include, for example, a hard disk drive or other disk drive, read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry.

As a general operational overview, the multimedia system 100 receives encoded video data 124 representing a video stream from any of a variety of multimedia sources, such as, for example, a file server or other video streaming service via the Internet or other type of network, an optical disc (e.g., DVD or Blu-Ray) player, a local file store, and the like. The codec engine 108 operates to decode the encoded video data 124 to generate a series of image frames representing a video stream. The graphics engine 110 operates to enhance or otherwise further process the video image stream, such as by implementing resolution upscaling, filtering, on-screen display (OSD) overlay, and the like. The resulting processed video image stream is input to the compression engine 112, which compresses each image frame in the video image stream to generate corresponding compressed image data 126, which is temporarily stored via the memory controller 114 in a frame buffer 128 implemented in, for example, memory 106. In anticipation of displaying the image frame represented by the stored compressed image data 126, the decompression engine 116 accesses the compressed image data 126 from the frame buffer 128 via the memory controller 114, decompresses the compressed image data 126 to generate decompressed image data representative of the image frame, and provides the decompressed image data to the display controller 118 for use in displaying the image frame at the display 120.

In at least one embodiment, the compression engine 112 utilizes an arithmetic coding process that divides each image frame into multiple sets of pels, and each set of pels is encoded into a set of codewords. For example, the compression engine 112 may utilize Rice coding or other Golomb-based coding. Such encoding processes generate codewords that have two components: a fixed-length component comprising a fixed number of bits that depends on the particular coding configuration implemented; and a variable-length component that is a unary value having a variable number of bits of one bit value terminated by a designated termination bit of the opposite value. Typically, the unary value is represented as a set of zero or more "1" bits terminated by a "0" bit. For example, a value of 2 may be represented as "110", a value of 4 may be represented as "11110", and a value of 6 may be represented as "1111110". As such, the techniques of the present disclosure are described in this example context of using a 0 bit as the termination bit. However, the opposite representation may be used, with the unary value represented as a set of zero or more 0 bits terminated by a 1 bit, and the techniques described herein adapted accordingly.

As noted above, conventional approaches simply concatenate whole codewords to generate the compressed image data to be stored in a frame buffer. As also noted above, this approach increases the decompression complexity due to the difficulty in determining whether a particular 0 bit is a termination bit or a bit of one of the fixed-length components. To reduce decompression complexity, in at least one embodiment the compression engine 112 implements a compression process whereby each set of codewords is separated into its constituent fixed-length and variable-length components, the variable-length components of the set of codewords are combined together into a variable-length portion and the fixed-length components of the set of codewords are combined together into a fixed-length portion. The fixed-length portion is then prepended or appended (depending on implementation) to the variable-length portion to form a corresponding bit segment representative of the set of codewords. The bit segment is then stored to the frame buffer 128 as part of the compressed image data 126.

When decompressing the compressed image data 126, the decompression engine 116 utilizes a search window to scan for a variable-length portion of a bit segment by identifying a bit string having a number of termination bits equal to the number of codewords in each set of codewords. As this bit string identifies a variable-length portion of a segment, and as the fixed-length portion of the segment immediately precedes or follows (depending on implementation) the variable-length portion, the decompression engine 116 identifies the fixed-length portion as a bit string starting adjacent to the bit string representing the variable-length portion and having a length equal to the number of codewords in the set multiplied by the number of bits a fixed-size component. The decompression engine 116 may then parse out each variable-length component from the variable-length portion and combine it with its corresponding fixed-length component from the fixed-length portion to recreate the corresponding codeword. The decompression engine 116 then shifts the search window to the first bit of the bit string representing the next bit segment's variable-length portion to begin the process anew for the next bit segment in the compressed image data. Under this approach, multiple codewords may be rapidly and accurately identified in a single clock cycle.

Figure 2:
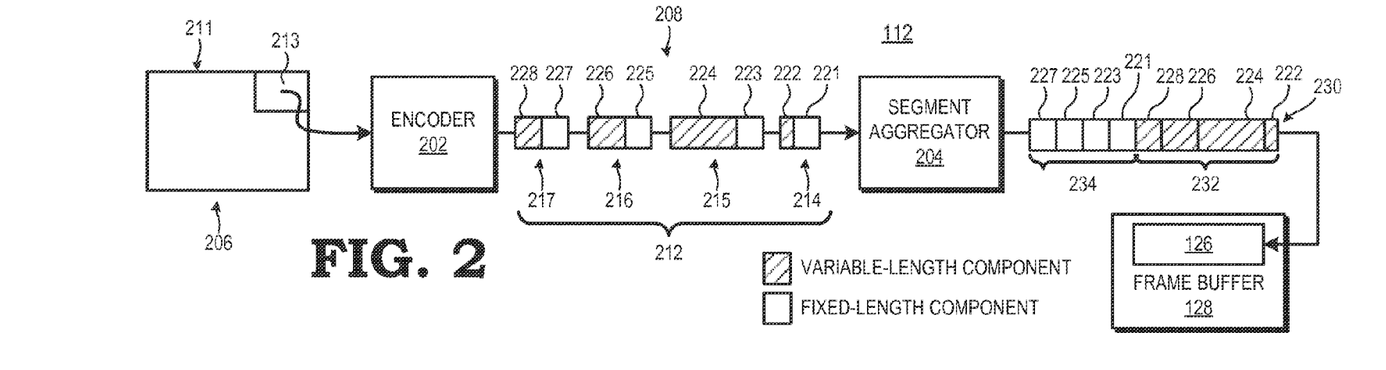
FIG. 2 is a block diagram illustrating an example operation of a compression engine of the multimedia system of FIG. 1 in accordance with at least one embodiment.
Figure 3:
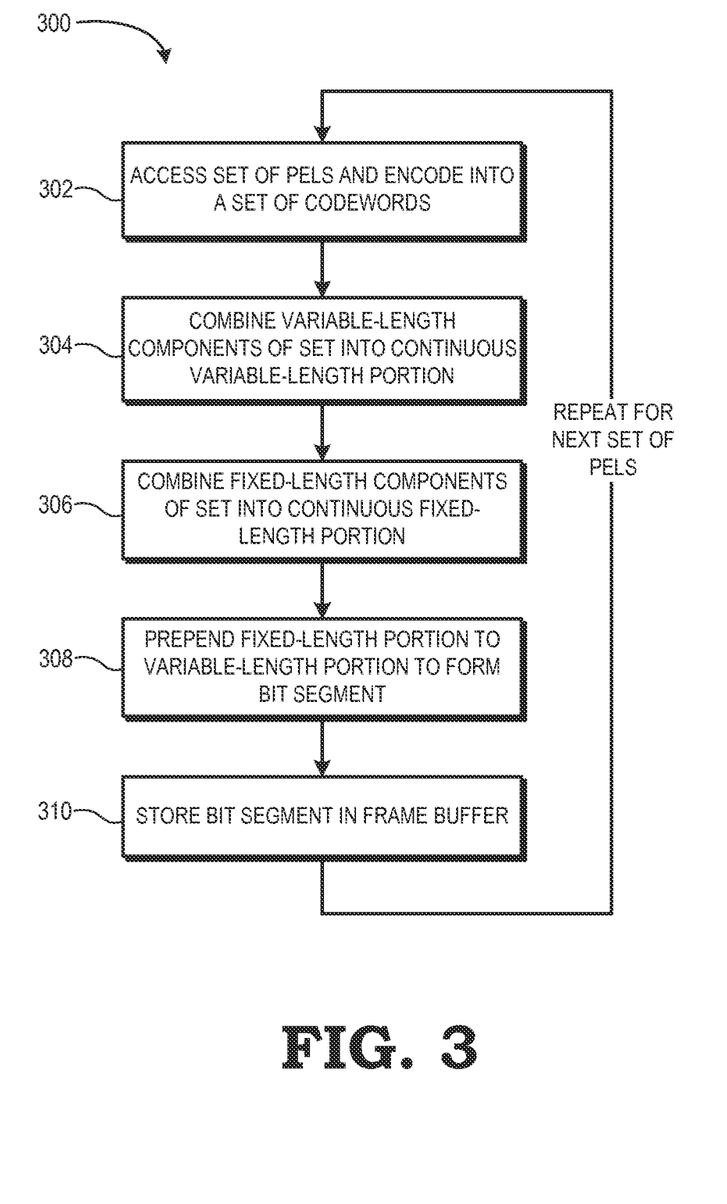
FIG. 3 is a flow diagram illustrating a method for image data compressing using codeword component aggregation as implemented by the compression engine of FIG. 2 in accordance with at least one embodiment of the present disclosure.

FIGS. 2 and 3 together illustrate an example implementation of the compression engine 112 and a method of its operation in accordance with at least one embodiment. For ease of illustration, an implementation whereby the fixed-length portion is prepended to the variable-length portion of a bit segment is described below. However, these same techniques may be modified for an implementation whereby the fixed-length portion is appended to the variable-length portion using the guidelines described herein.

In the depicted example of FIG. 2, the compression engine 112 includes an encoder 202 and a segment aggregator 204. The encoder 202 includes an input to receive uncompressed image data 206 and an output to provide a stream 208 of codewords based on application of a Rice encoding process or other arithmetic encoding process performed on the uncompressed image data 206. The segment aggregator 204 includes an input to receive the stream 208 of codewords and an output to provide an output bit stream representing the compressed image data 126 of FIG. 1.

FIG. 3 illustrates a method 300 of operation of the compression engine 112 of FIG. 2. Initially, the uncompressed image data 206 is streamed to the encoder 202. In at least one embodiment, the image frame represented by the uncompressed image data 206 is partitioned into a plurality of sets of pels, and each set of pels is compressed as a unit. Accordingly, at block 302 the encoder 202 accesses the data representing a set of pels and encodes the set of pels into a corresponding set of codewords. To illustrate with reference to FIG. 2, the encoder 202 may access a set 213 of pels of an image frame 211 and encode them to generate a set 212 of codewords. For ease of illustration, in this example the set 212 includes four codewords 214, 215, 216, and 217. However, it will be appreciated that for a typical pel block (e.g., 16 pels×8 pels), the number of codewords typically will be considerably larger. Each codeword has a fixed-length component and a variable-length component. To illustrate, codeword 214 has a fixed-length component 221 and a variable-length component 222, codeword 215 has a fixed-length component 223 and a variable-length component 224, codeword 216 has a fixed-length component 225 and a variable-length component 226, and codeword 217 has a fixed-length component 227 and a variable-length component 228.

At block 304 the segment aggregator 204 combines the variable-length components 222, 224, 226, and 228 of the set 212 into a continuous variable-length portion 232 and at block 306 the segment aggregator 204 combines the fixed-length components 221, 223, 225, and 227 of the set 212 into a continuous fixed-length portion 234. At block 308 the segment aggregator 204 prepends the fixed-length portion 234 to the front of the variable-length portion 232 to form a bit segment 230 representing the set 212 of codewords, and at block 310 the segment aggregator 204 stores the bit segment 230 to the frame buffer 128 as part of the bit string representing the compressed image data 126. The process of blocks 302, 304, 306, 308, and 310 then may be repeated for each set of pels of the image frame 211 to complete storage of the compressed image data 126 for the image frame 211 in the frame buffer 128.

Figure 4:
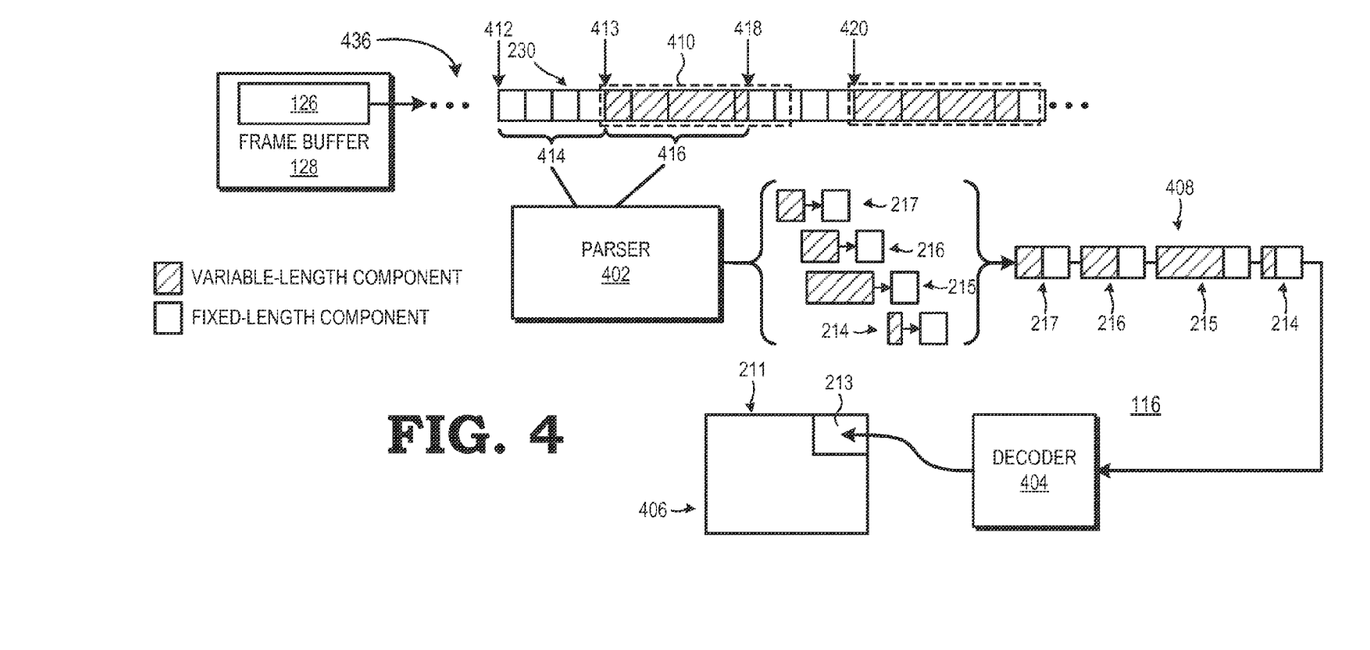
FIG. 4 is a block diagram illustrating an example operation of a decompression engine of the video processing system of FIG. 1 in accordance with at least one embodiment.
Figure 5:
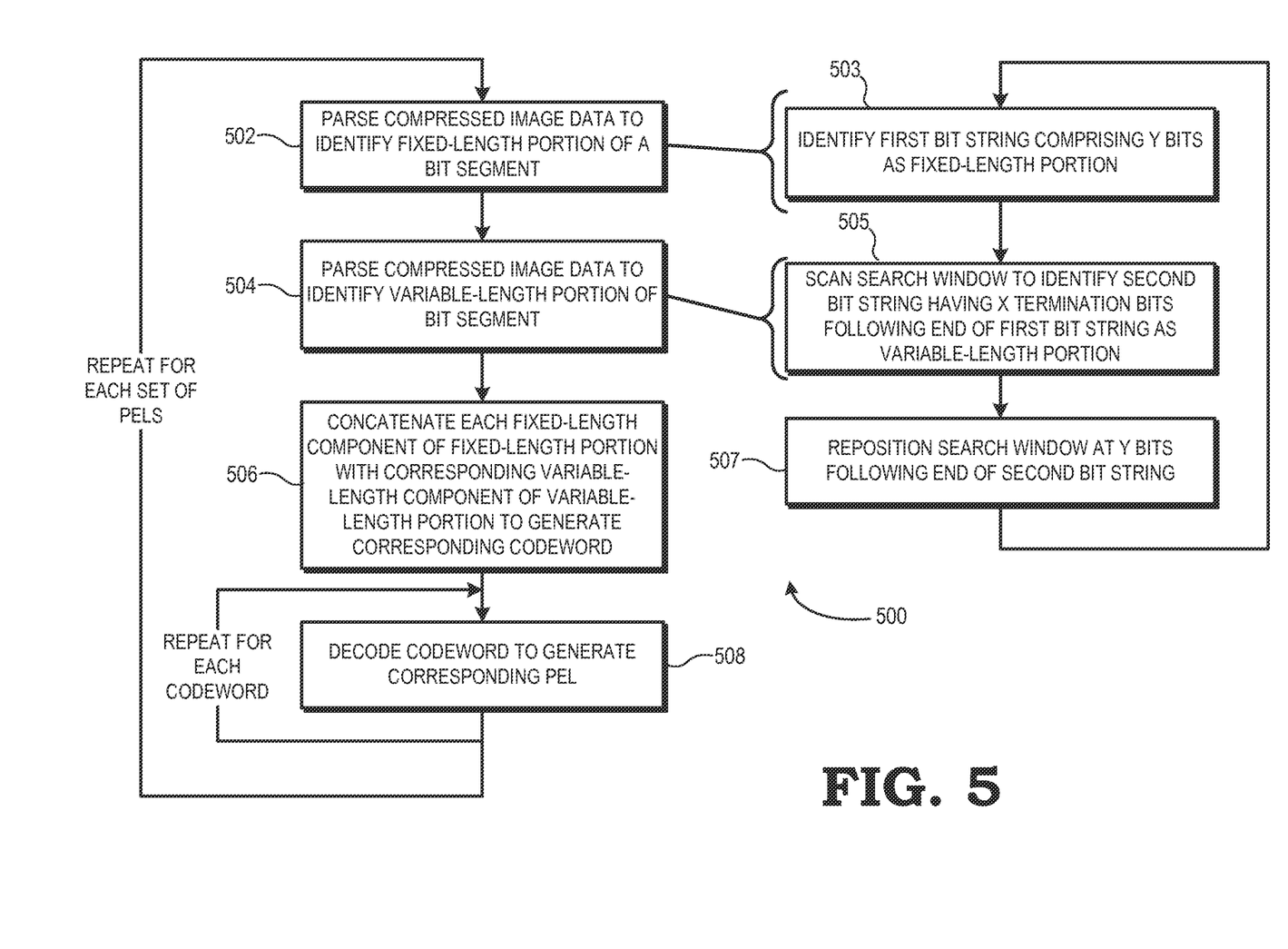
FIG. 5 is a flow diagram illustrating a method for image data decompression using codeword component disaggregation as implemented by the decompression engine of FIG. 4 in accordance with at least one embodiment of the present disclosure.

FIGS. 4 and 5 together illustrate an example implementation of the decompression engine 116 and a method of its operation in accordance with at least one embodiment. In the depicted example of FIG. 4, the decompression engine 116 includes a parser 402 and a decoder 404. The parser 402 includes an input to receive the compressed image data 126 and an output to provide a stream 408 of codewords. The decoder 404 includes an input to receive the stream 408 and an output to generate uncompressed image data 406 representative of an image frame based on application of a Rice decoding process or other arithmetic decoding process performed on sets of codewords in the stream 408 of codewords.

FIG. 5 illustrates a method 500 of operation of the decompression engine 116 of FIG. 4. As described above with reference to FIGS. 2 and 3, the compressed image data 126 is generated through the aggregation of variable-length components of each set of codewords into a variable-length portion of a bit segment of the compressed image data 126 and the aggregation of fixed-length components of each set of codewords into a fixed-length portion of the bit segment, with the fixed-length portion being prepended to the front of the variable-length portion. Accordingly, method 500 operates by identifying each bit segment in the compressed image data 126 and processing it to reconstruct the original codewords of the set of codewords represented by the bit segment.

To this end, at block 502 the parser 402 parses the compressed image data 126 to identify a fixed-length portion of a bit segment. As the fixed-length portion of a bit segment is of a known, fixed size Y that is equal to the number of codewords in the set of codewords multiplied by the number of bits in a fixed size component and as the fixed-length portion is known to be prepended to the front of the variable-length portion, as illustrated by block 503 in one embodiment the parser 402 can identify the Y bits following the end of the variable-length portion of the previous bit segment (or the Y bits following the start of the bit string 436 representing the compressed image data 126) as the bit string representing the fixed-length portion of the bit segment. To illustrate, assuming that the fixed-length components of the codewords 214-217 are two bits each, and as there are four codewords in the set, the parser 402 can identify the eight bits (4 codewords×2 bits each codeword) following the bit position 412 (representing the start of the compressed image data 126 or the end of the variable-length portion of the previous bit segment) and extending to bit position 413 as the bit string 414 representing the fixed-length portion 234 of the bit segment 230.

With the position of the fixed-length portion 234 identified, as represented by block 505 in one embodiment the parser 402 can identify a variable-length portion by utilizing a search window 410 that is positioned in the bit string 436 at the end of the identified fixed-length portion and then scanned to identify a bit string extending from the start of the search window to the Xth termination bit in the search window 410. This bit string thus is the variable-length portion of a bit segment. To illustrate, with the search window 410 positioned at the bit position 413 representing the end bit of the bit string 414 representing the fixed-length portion 234, the parser 402 identifies a bit string 416 between the bit position 413 and the fourth 0 bit at bit position 418 as being the bit string representing the variable-length portion 232 of the bit segment 230.

With the variable-length portion and fixed-length portion of a bit segment identified in the compressed image data 126, at block 506 the parser 402 operates to disaggregate the variable-length components and fixed-length components and then combine each variable-length component with its corresponding fixed-length component to recreate a corresponding codeword of the set of codewords represented by the bit segment. To illustrate using the preceding example, the bit string 416 represents the variable-length portion 232, which contains the variable-length components 222, 224, 226, and 228, and the bit string 414 represents the fixed-length portion 234, which contains the fixed-length components 221, 223, 225, and 227. The parser 402 can identify each of the variable-length components 222, 224, 226, and 228 based on the four termination bits present in the bit string 416, and then combine each identified variable-length component with the fixed-length component in the same position within the bit string 414. As a result, fixed-length component 221 is combined with variable-length component 222 to recreate the codeword 214, fixed-length component 223 is combined with variable-length component 224 to recreate codeword 215, fixed-length component 225 is combined with variable-length component 226 to recreate codeword 216, and fixed-length component 227 is combined with variable-length component 228 to recreate codeword 217.

Further, with the variable-length portion and fixed-length portion of a bit segment identified in the compressed image data 126, at block 507 the start of the search window 410 is repositioned to the Yth bit from bit position 418 to the bit position 420, which marks the end of the fixed-length portion of the next bit segment in the compressed image data 126, and thus placing the search window 410 in the proper position to identify the variable-length portion of the next bit segment in the next iteration of the process of blocks 502/503 and 504/505.

As the set of codewords is recreated by the parser 402, the decoder 404 may decode the codewords of the set at block 508 to recreate the image data representing the set 213 of pels of the image frame 211, which then may be provided to the display controller 118 for display as part of the image frame 211 on the display 120 (FIG. 1).

Figure 6:
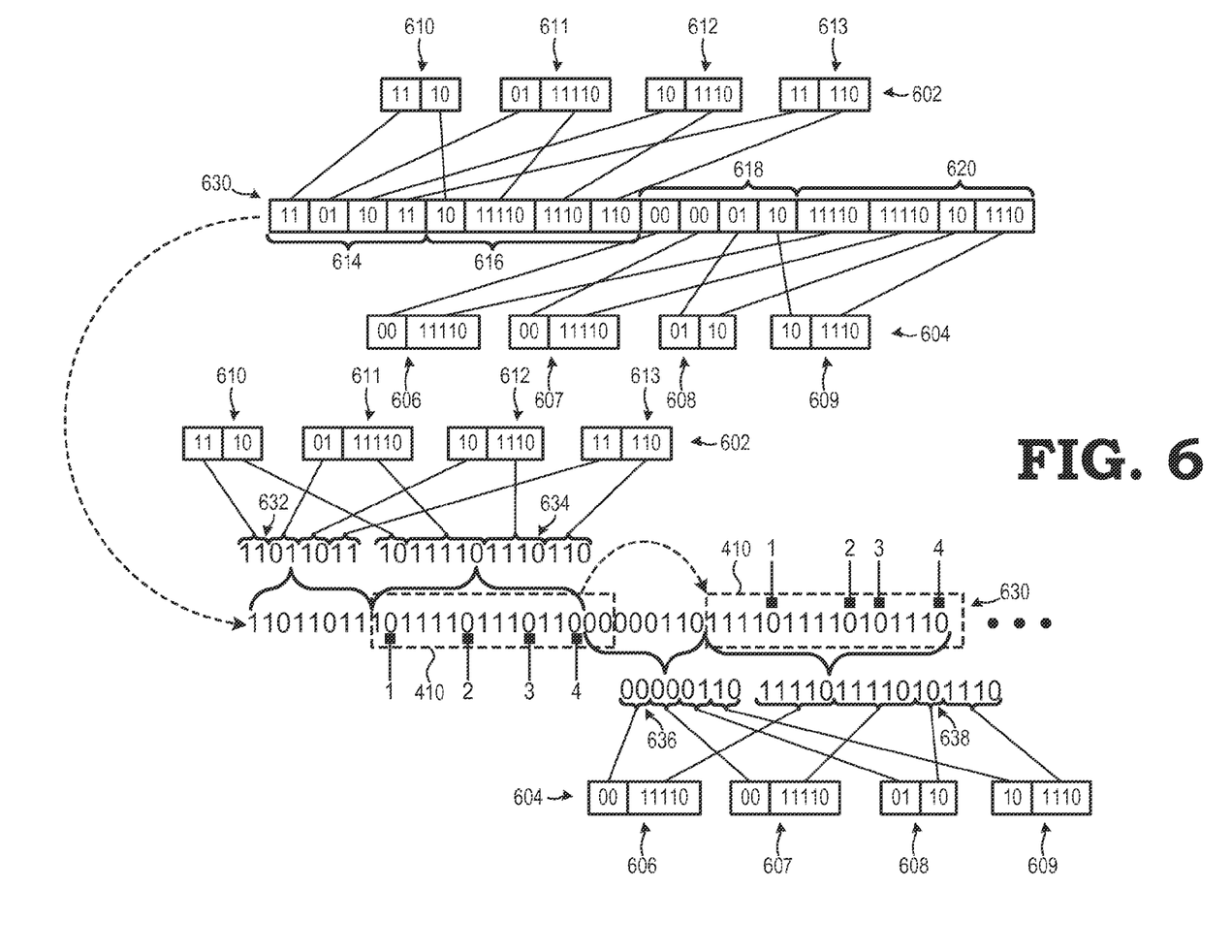
FIG. 6 is a diagram illustrating an example application of codeword component aggregation and disaggregation processes in accordance with at least one embodiment of the present disclosure.

FIG. 6 illustrates an example application of the image data compression and decompression processes utilizing codeword component aggregation and disaggregation, respectively, as described above. The depicted example illustrates the processing of two sets of codewords, identified as sets 602 and 604. The set 602 represents the initial set of codewords generated by the encoder 202 (FIG. 2) from compression of an initial set of pels of an image frame and comprises four codewords 610, 611, 612, and 613. The set 604 represents the next set of codewords generated by the encoder 202 from the next set of pels of the image frame and comprises four codewords 606, 607, 608, and 609. For this example, assume that the encoding process generates codewords with fixed-length components having two bits and variable-length components terminated by a 0 bit as the termination bit.

In accordance with the aggregation process described above whereby the variable-length components and fixed-length components of a set of codewords are separately combined together as a continuous variable-length portion and a continuous fixed-length portion of a bit segment, the variable-length components of the set 602 are combined by the segment aggregator 204 (FIG. 2) to form variable-length portion 616 and the fixed-length components of the set 602 are combined by the segment aggregator 204 to form fixed-length portion 614 of a first bit segment. Similarly, the variable-length components of the set 604 are combined by the segment aggregator 204 to form variable-length portion 620 and the fixed-length components of the set 604 are combined by the segment aggregator 204 to form fixed-length portion 618 of a second bit segment. As shown in FIG. 6, the fixed-length portion 614 is prepended to the front of the variable-length portion 616, the fixed-length portion 618 is prepended to the front of the variable-length portion 620, and the second bit segment is appended to the end of the first bit segment.

The resulting bit stream representing the two bit segments is stored as a bit string to the frame buffer 128 (FIG. 1). Subsequently, a bit string portion 630 of the bit stream is accessed by the parser 402 (FIG. 4) and stored to a register or other local storage component. In this example, the set 602 represents the initial set of codewords. Thus, as each fixed-length component is known in this example to have two bits, and as there are four codewords per set, the parser identifies the 8 bits (4×2) immediately following the start of the bit string portion 630 as a bit string 632 representing the fixed-length portion of the first bit segment. From this, the parser 402 parses the bit string 632 into four fixed-length components, as illustrated. The parser 402 then positions the search window 410 to start at the 9th bit in the bit string 630 and scans the bit string portion in the search window 410 to identify the fourth occurrence (as there are four codewords per set) of a termination bit (that is, a 0 bit) in the search window 410. In the depicted example, the four termination bits while the search window is in its initial position occur at the $2^{nd}$, $7^{th}$, $11^{th}$, and $14^{th}$ bit positions and are numbered 1-4. As such, the parser 402 identifies the bit string 634 extending from the start of the search window 410 to the fourth occurrence of the termination bit as the variable-length portion of the first bit segment. From this, and the identification of the four termination bits, the parser 402 parses the bit string 634 into four variable-length components, as illustrated. With the individual components so identified, the parser 402 combines each fixed-length component from bit string 632 with its corresponding variable-length component from bit string 634 to recreate the codewords 610-613 of set 602, which then may be decoded by the decoder 404 to recreate the initial set of pels of the image frame.

To begin the parsing process for the next bit segment, the parser 402 identifies bit string 636 comprising the 8 bits following the end of bit string 634 as the fixed-length portion of a second bit segment, and the parser 402 parses the bit string 636 into four fixed-length components, as illustrated.

The parser 402 then shifts the search window 410 to the end of the bit string 636 such that the start of the search window 410 is the bit of the bit string portion 630 that follows the end of the fixed-length portion of the second bit segment. The parser 402 again searches the search window 410 for the fourth occurrence of a termination bit within the search window. In the depicted example, the four termination bits while the search window is in its shifted position occur at the $5^{th}$, $10^{th}$, $12^{th}$, and $16^{th}$ bit positions and are likewise numbered 1-4. Accordingly, the parser 402 identifies the bit string 638 extending from the start of the repositioned search window 410 to the fourth occurrence of the termination bit as the variable-length portion of the second set 604 of codewords. From this, and the identification of the four termination bits, the parser 402 parses the bit string 638 into four variable-length components, as illustrated. With the individual components so identified, the parser 402 combines each fixed-length component from bit string 636 with its corresponding variable-length component from bit string 638 to recreate the codewords 606-609 of set 604, which then may be decoded by the decoder 404 to recreate the second set of pels of the image frame.

As illustrated by the example of FIG. 6, multiple codewords of a set may be conclusively identified and processed from the stored compressed image data and processed in parallel. Thus, depending on the architecture of the multimedia system 100, multiple codewords may be parsed from the compressed image data in the same clock cycle. Moreover, as identification of the variable-length portions of multiple codewords is based on the identification of the same number of termination bits, and as identification of the fixed-length portions of multiple codewords is based on the end position of the variable-length portion, parsing of the compressed image data may be implemented using less complex logic compared to conventional approaches that simply interleave codewords and thus are subject to false identification of 0 bits in fixed-length components as termination bits of variable-length components.

In some embodiments, certain aspects of the techniques described above may be implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

In this document, relational terms such as "first" and "second", and the like, may be used solely to distinguish one entity or action from another entity or action without necessarily requiring or implying any actual relationship or order between such entities or actions or any actual relationship or order between such entities and claimed elements. The term "another", as used herein, is defined as at least a second or more. The terms "including", "having", or any variation thereof, as used herein, are defined as comprising.

Other embodiments, uses, and advantages of the disclosure will be apparent to those skilled in the art from consideration of the specification and practice of the disclosure disclosed herein. The specification and drawings should be considered as examples only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method comprising:
   encoding, at a video processing system, picture elements (pels) of an image frame to generate compressed image data; and
   storing the compressed image data in a frame buffer of the video processing system;
   wherein encoding the pels of the image frame comprises:
      for each set of pels of the image frame:
         encoding the set of pels to generate a set of codewords, each codeword comprising a fixed-length component and a variable-length component, the variable-length component comprising a unary value;
         combining the variable-length components of the set of codewords together into a continuous variable-length portion of a corresponding bit segment of the compressed image data; and
         combining the fixed-length components together into a continuous fixed-length portion of the corresponding bit segment.

2. The method of claim 1, wherein the fixed-length portion is prepended to the front of the variable-length portion in the corresponding bit segment.

3. The method of claim 1, wherein encoding the set of pels comprises encoding the set of pels using a Rice encoding process.

4. The method of claim 1, further comprising:
   accessing, at a display system, the compressed image data from the frame buffer;
   decoding, at the display system, the compressed image data to generate the pels of the image frame, wherein decoding the compressed image data comprises:
      parsing the compressed image data to identify the fixed-length portion of a corresponding bit segment;
      parsing the compressed image data to identify the variable-length portion of the corresponding bit segment based on identifying the fixed-length portion of the corresponding bit segment;
concatenating each fixed-length component of the fixed-length portion with a corresponding variable-length component of the variable-length portion to generate a corresponding codeword of a set of codewords for the bit segment; and
decoding the set of codewords to generate a corresponding set of pels of the image frame.

5. The method of claim 4, wherein:
each variable-length component is terminated by a termination bit having a predefined value;
each bit segment comprises a fixed number of codewords; and
parsing the compressed image data to identify the fixed-length portion of a corresponding bit segment comprises identifying a first bit string in the compressed image data, the first bit string having a number of bits equal to the fixed number of codewords multiplied by a bit size of the fixed-length components;
parsing the compressed image data to identify the variable-length portion comprises scanning a search window on a portion of the compressed image data immediately adjacent to the first bit string to identify a second bit string comprising a number of termination bits equal to the fixed number of codewords as the variable-length portion; and
concatenating each fixed-length component of the fixed-length portion with a corresponding variable-length component to generate a corresponding codeword comprises concatenating each bit subset of the second bit string that is terminated with a termination bit with a corresponding bit subset of the first bit string to generate a corresponding codeword of the set of codewords.

6. The method of claim 5, further comprising:
shifting the search window to a position in the compressed image data representing the start of the next bit segment's variable-length portion and repeating the processes of parsing and concatenating for the next bit segment in the compressed image data.

7. A method comprising:
accessing, at a display system, compressed image data stored in a frame buffer, the compressed image data comprising a stream of bit segments, each bit segment comprising a fixed-length portion comprising a continuous set of fixed-length components of codewords of a corresponding set of codewords and comprising a variable-length portion comprising a continuous set of variable-length components of the codewords of the corresponding set of codewords, wherein the variable-length components are unary values;
decoding, at the display system, the compressed image data to generate a set of picture elements (pels) of an image frame, wherein decoding the compressed image data comprises:
 parsing the compressed image data to identify the fixed-length portion of a corresponding bit segment;
 parsing the compressed image data to identify the variable-length portion of the corresponding bit segment based on identifying the fixed-length portion of the corresponding bit segment;
 concatenating each fixed-length component of the fixed-length portion with a corresponding variable-length component of the variable-length portion to generate a corresponding codeword of a set of codewords for the bit segment; and
 decoding the set of codewords to generate a corresponding set of pels of the image frame.

8. The method of claim 7, wherein:
each variable-length component is terminated by a termination bit having a predefined value;
each bit segment comprises a fixed number of codewords;
parsing the compressed image data to identify the fixed-length portion of a corresponding bit segment comprises identifying a first bit string in the compressed image data, the first bit string having a number of bits equal to the fixed number of codewords multiplied by a bit size of the fixed-length components;
parsing the compressed image data to identify the variable-length portion comprises scanning a search window on a portion of the compressed image data immediately adjacent to the first bit string to identify a second bit string comprising a number of termination bits equal to the fixed number of codewords as the variable-length portion; and
concatenating each fixed-length component of the fixed-length portion with a corresponding variable-length component to generate a corresponding codeword comprises concatenating each bit subset of the second bit string that is terminated with a termination bit with a corresponding bit subset of the first bit string to generate a corresponding codeword of the set of codewords.

9. The method of claim 8, further comprising:
shifting the search window to a position in the compressed image data representing the start of the next bit segment's variable-length portion and repeating the processes of parsing and concatenating for the next bit segment in the compressed image data.

10. The method of claim 7, further comprising:
providing the image frame for display.

11. A system comprising:
a compression engine to encode picture elements (pels) of an image frame to generate compressed image data; and
a memory controller to store the compressed image data in a frame buffer;
wherein the compression engine comprises:
 an encoder to, for each set of pels of the image frame, encode the set of pels to generate a set of codewords, each codeword comprising a fixed-length component and a variable-length component, the variable-length component comprising a unary value; and
 a segment aggregator to, for each set of codewords, combine the variable-length components of the set of codewords together into a continuous variable-length portion of a corresponding bit segment of the compressed image data, and combine the fixed-length components together into a continuous fixed-length portion of the corresponding bit segment.

12. The system of claim 11, wherein the segment aggregator prepends the fixed-length portion to the front of the variable-length portion in the corresponding bit segment.

13. The system of claim 11, wherein the encoder is to terminate each variable-length component with a termination bit having a predefined value.

14. The system of claim 11, further comprising:
a decompression engine to access the compressed image data from the frame buffer and to decode the compressed image data to generate the pels of the image frame, wherein the decompression engine comprises:
 a parser to parse the compressed image data to identify the fixed-length portion of a corresponding bit segment and parse the compressed image data to identify the variable-length portion of the corresponding bit segment based on identifying the fixed-length portion of the corresponding bit segment, and concatenate each fixed-length component of the fixed-length portion with a corresponding variable-length component of the variable-length portion to generate a corresponding codeword of a set of codewords for the bit segment; and a decoder to decode the set of codewords to generate a corresponding set of pels of the image frame.

15. The system of claim 14, wherein:

each variable-length component is terminated by a termination bit having a predefined value;

each bit segment comprises a fixed number of codewords; and the parser is to parse the compressed image data to identify the fixed-length portion of a corresponding bit segment by identifying a first bit string in the compressed image data, the first bit string having a number of bits equal to the fixed number of codewords multiplied by a bit size of the fixed-length components;

the parser is to parse the compressed image data to identify the variable-length portion by scanning a search window on a portion of the compressed image data immediately adjacent to the first bit string to identify a second bit string comprising a number of termination bits equal to the fixed number of codewords as the variable-length portion; and the parser is to concatenate each fixed-length component of the fixed-length portion with a corresponding variable-length component to generate a corresponding codeword by concatenating each bit subset of the second bit string that is terminated with a termination bit with a corresponding bit subset of the first bit string to generate a corresponding codeword of the set of codewords.

16. The system of claim 15, wherein:

the parser further is to shift the search window to a position in the compressed image data representing the start of the next bit segment's variable-length portion and repeating the processes of parsing and concatenating for the next bit segment in the compressed image data.

17. A system comprising:

a memory controller to access compressed image data stored in a frame buffer, the compressed image data comprising a stream of bit segments, each bit segment comprising a fixed-length portion comprising a continuous set of fixed-length components of codewords of a corresponding set of codewords and comprising a variable-length portion comprising a continuous set of variable-length components of the codewords of the corresponding set of codewords, wherein the variable-length components are unary values;

a decompression engine to decode the compressed image data to generate a set of picture elements (pels) of an image frame, wherein the decompression engine comprises:

a parser to parse the compressed image data to identify the fixed-length portion of a corresponding bit segment, to parse the compressed image data to identify the variable-length portion of the corresponding bit segment based on identifying the fixed-length portion of the corresponding bit segment, and to concatenate each fixed-length component of the fixed-length portion with a corresponding variable-length component of the variable-length portion to generate a corresponding codeword of a set of codewords for the bit segment; and a decoder to decode the set of codewords to generate a corresponding set of pels of the image frame.

18. The system of claim 17, wherein:

each variable-length component is terminated by a termination bit having a predefined value;

each bit segment comprises a fixed number of codewords;

the parser is to parse the compressed image data to identify the fixed-length portion of a corresponding bit segment by identifying a first bit string in the compressed image data, the first bit string having a number of bits equal to the fixed number of codewords multiplied by a bit size of the fixed-length components;

the parser is to parse the compressed image data to identify the variable-length portion by scanning a search window on a portion of the compressed image data immediately adjacent to the first bit string to identify a second bit string comprising a number of termination bits equal to the fixed number of codewords as the variable-length portion; and the parser is to concatenate each fixed-length component of the fixed-length portion with a corresponding variable-length component to generate a corresponding codeword by concatenating each bit subset of the second bit string that is terminated with a termination bit with a corresponding bit subset of the first bit string to generate a corresponding codeword of the set of codewords.

19. The system of claim 18, wherein:

the parser further is to shift the search window to a position in the compressed image data representing the start of the next bit segment's variable-length portion and repeating the processes of parsing and concatenating for the next bit segment in the compressed image data.

20. The system of claim 17, further comprising:

a display controller to provide the image frame for display.

* * * * *